United States Patent
Narita

(10) Patent No.: US 9,331,648 B2
(45) Date of Patent: May 3, 2016

(54) AMPLIFIER CIRCUIT WITH IMPROVED SLEW RATE

(71) Applicant: Takashi Narita, Tokyo (JP)

(72) Inventor: Takashi Narita, Tokyo (JP)

(*) Notice: Subject to any disclaimer, the term of this patent is extended or adjusted under 35 U.S.C. 154(b) by 73 days.

(21) Appl. No.: 14/191,816

(22) Filed: Feb. 27, 2014

(65) Prior Publication Data

US 2014/0240043 A1 Aug. 28, 2014

Related U.S. Application Data

(60) Provisional application No. 61/770,014, filed on Feb. 27, 2013.

(51) Int. Cl.
| | |
|---|---|
| *H03F 3/45* | (2006.01) |
| *H03F 1/34* | (2006.01) |
| *H03F 3/68* | (2006.01) |
| *H03F 1/22* | (2006.01) |
| *H03F 1/14* | (2006.01) |

(52) U.S. Cl.
CPC ............. *H03F 3/45632* (2013.01); *H03F 1/14* (2013.01); *H03F 1/223* (2013.01); *H03F 1/342* (2013.01); *H03F 3/45183* (2013.01); *H03F 3/45192* (2013.01); *H03F 3/68* (2013.01); *H03F 2203/45311* (2013.01); *H03F 2203/45476* (2013.01); *H03F 2203/45478* (2013.01); *H03F 2203/45512* (2013.01); *H03F 2203/45528* (2013.01); *H03F 2203/45631* (2013.01); *H03F 2203/45674* (2013.01); *H03F 2203/45701* (2013.01)

(58) Field of Classification Search
CPC .................................................... H03F 3/45179
USPC .................. 330/254, 255, 258, 261, 292, 310
See application file for complete search history.

(56) References Cited

U.S. PATENT DOCUMENTS 5,446,412 A * 8/1995 Kimyacioglu et al. ....... 330/255

* cited by examiner

*Primary Examiner* — Khanh V Nguyen
*Assistant Examiner* — Khiem Nguyen

(57) ABSTRACT

An amplifier circuit for improved slew rate consists of three main sections, which are the common mode rejection stage, primary gain stage and the output stage. The main circuit is a modified version of the fully differential operational amplifier circuit. The modifications done to this said circuit, enhances impedance which results in improved slew rate. In addition to the modifications in the primary gain stage, there's a cascade configuration to prevent systematic offset. The common mode rejection stage is primarily used due to the narrow common mode input range resulting from the cascade configuration. Additionally, another primary gain stage is included in the design prior to the output, since the output from the primary gain stage is narrow. This structure results in producing an improved slew rate.

8 Claims, 13 Drawing Sheets

AMPLIFIER CIRCUIT WITH IMPROVED SLEW RATE

The current application claims a priority to the U.S. Provisional Patent Application Ser. No. 61/770,014, filed on Feb. 27, 2013.

FIELD OF THE INVENTION

The present invention relates to a high performance amplifier circuit. More specifically, the invention is an amplifier circuit with certain modifications that result in improved slew rate.

BACKGROUND OF THE INVENTION

Slew rate is defined to be the maximum rate of change in output voltage. This can be measured using a function generator and oscilloscope, and is measured in Volts per micro second (V/μs). The higher the slew rate is, the faster the output can change. Since Slew Rate imposes high frequency limitations on the device it is beneficial to find methods to improve slew rate.

One method to improve slew rate is adding resistors to each source of transistors which take plus or minus input signal at their gate in differential input stage. This improvement is achieved thanks to the fact that, by adding the resistors, open loop gain is reduced and output resistance of the input stage is enhanced. So phase compensation capacitor (Cc) required for stability of the circuit can be reduced, and the reduced Cc leads to improvement of slew rate. However, as mentioned above, this improvement is achieved at expense of open loop gain of the operational amplifier. With this reduced open loop gain, several properties like input and output impedance get worsened.

In order to improve slew rate without worsening properties, certain modifications can be done to the circuit. The objective of the present invention is to enhance the impedance of the gain stage and reduce the compensation capacitance without sacrifice of open loop gain.

SUMMARY OF THE INVENTION

The invention comprises three main sections. To be specific, a common mode rejection stage, a primary gain stage and an output stage.

The primary gain stage is designed to have high output impedance. The circuit for this section of the invention is a regular fully differential op-amp circuit, except for the fact that the compensation capacitance (Cc) is added only to one side (FIG. 3) and the output is taken from the same side.

The primary gain stage uses a cascade configuration to prevent systematic offset from occurring. Transistors M8-M11 and M18 and M19 in FIG. 5 are used to satisfy this need. This configuration results in narrow common mode input range. Due to this, a common mode rejection stage should be used to reject common mode signals.

As a result of these modifications, the primary gain stage results in having high output impedance. Therefore, as mentioned before slew rate can be improved by using a reduced compensation capacitance.

DETAILED DESCRIPTION OF THE INVENTION

All illustrations of the drawings and description of embodiments are for the purpose of describing selected version of the present invention and are not intended to limit the scope of the present invention.

The present invention is a modified circuit for a high performance amplifier which will result in improved slew rate. There can be multiple methods in improving slew rate. The present invention focuses on maintaining the RC time constant so that the frequency first pole remains the same as in the ordinary amplifier. This is achieved by having a high impedance gain stage. This results in a lower compensation capacitance value due to the constraints set on the RC time constant.

The invention, focused on improving slew rate with high impedance gain stage and low compensation capacitance includes three main sections. Which are a common mode rejection stage 1, a primary gain stage 10 and an output stage 16.

The primary gain stage 10 comprises a regular differential op-amp circuit. Except for the fact that, in the current invention the compensation capacitor (Cc) 19 is added only to one side, instead of both sides and the output is taken from the same side. Also, to prevent systematic offset the transistors are setup in a cascade configuration. This configuration results in narrow common mode input range. To avoid this fact, a common mode rejection stage 1 is provided before the primary gain stage 10. Also the cascade configuration results in narrow output range. Therefore a secondary gain stage 16 is included in the invented circuit.

Figure 1:
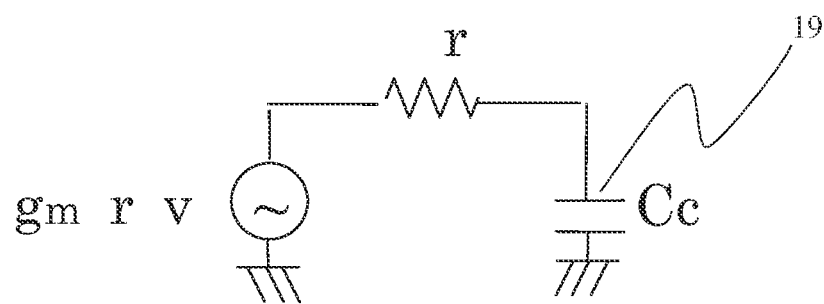
FIG. 1 is an Ordinary Amplifier Circuit.

In reference to FIG. 1, this illustrates the above mentioned ordinary amplifier circuit. Here we see an RC circuit with the resistor and capacitor connected in series. In this particular case, the RC time constant will be r·Cc, depending on the values of the circuit.

Figure 2:
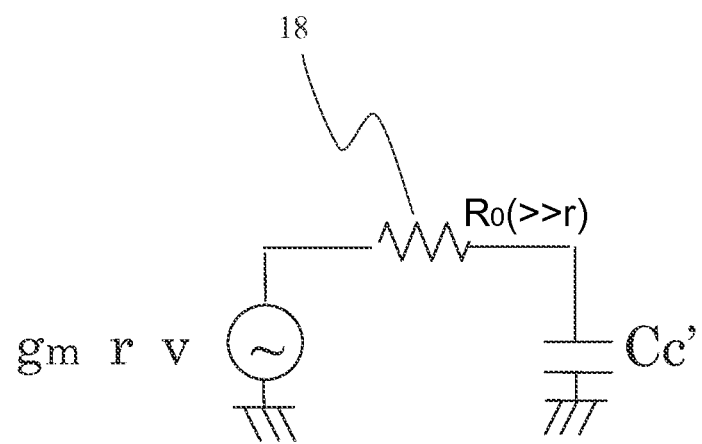
FIG. 2 is a circuit illustrating the concept of an amplifier circuit with improved slew rate.

In reference to FIG. 2, this illustrates the concept behind the invention. In this instance Ro>>r, in which r is the resistance value of the amplifier circuit in FIG. 1 and Ro is the new resistor value. In both cases, showed in FIG. 1 and FIG. 2 the frequency pole should be the same. Therefore, the only possible way to achieve this is with a lower compensation capacitance value, since the frequency pole depends on the RC time constant. In the preferred embodiment of the current invention, the compensation capacitance value is reduced by r/Ro times.

Figure 3:
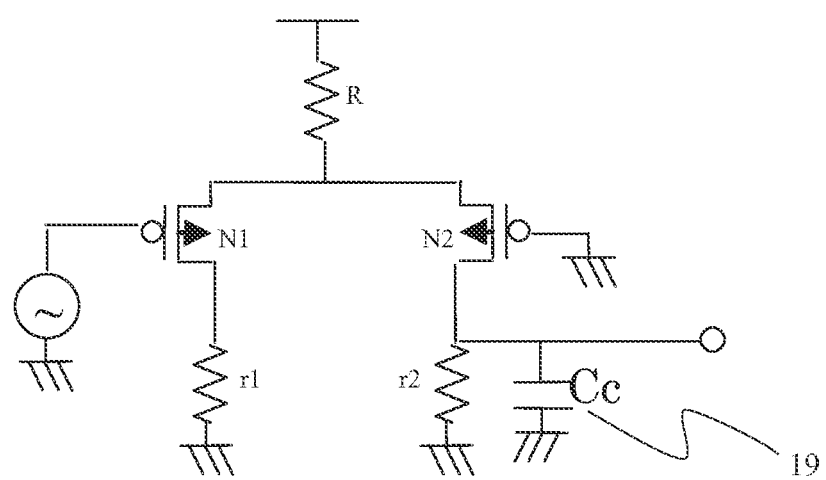
FIG. 3 is the invented circuit with improved slew rate to be used as a primary gain stage of an amplifier circuit.

FIG. 3 is an illustration of the invented circuit used for the primary gain stage 10. This circuit is a regular differential op-amp circuit. Yet, as mentioned above, the compensation capacitor 19 is added only to one side and the output is taken from the same side the compensation capacitor 19 is added to. The side, to which the compensation capacitor 19 is added to, is not an issue as long as the output is taken from the same side. In this case, the compensation capacitor 19 is added on to the right side but if preferred, the compensation capacitor 19 can be added to the left side as well.

Figure 4:
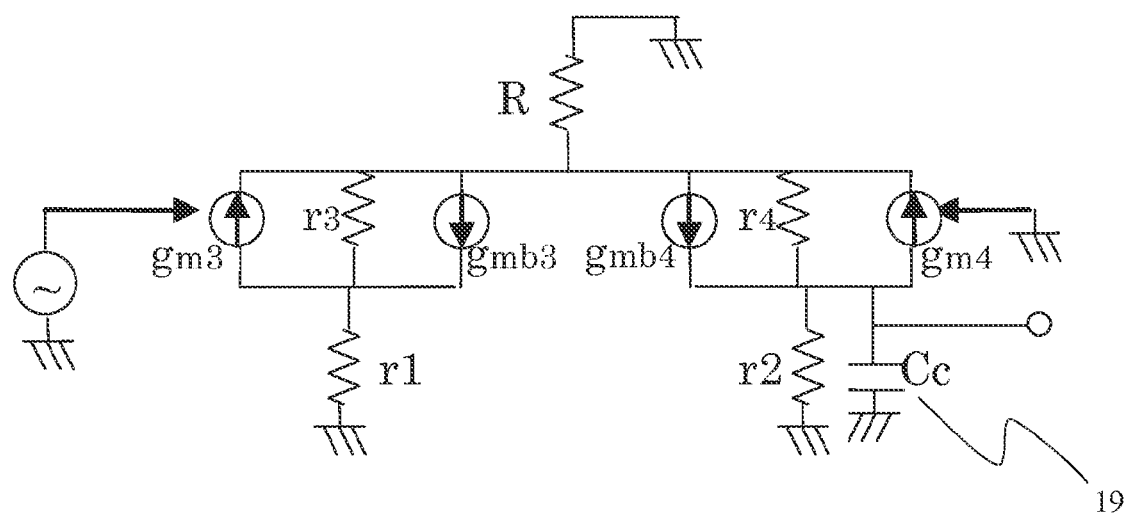
FIG. 4 is the Small Signal Equivalent Circuit of the circuit in FIG. 3.

FIG. 4 is an accurate illustration of the small signal equivalent circuit of the differential op-amp circuit shown in FIG. 3. Using the small signal circuit the output resistance for the invented circuit can be calculated. From calculations:

$$r_{out} = (r2 \| r'_{out}) \qquad \text{Eq}(1)$$

the value of $r_{out}$ is represented as in Eq(1) since r2 and $r'_{out}$ are in parallel.

Where;

$$r'_{out} = [r1 \cdot r4 \cdot (gm4+gmb4) \cdot R + r3 \cdot r4 \cdot (gm3+gmb3+gm4+gmb4) \cdot R + R \cdot r1 + r1 \cdot r4 + R \cdot (r3+r4) + r3 \cdot r4]/[(gm3+gmb3) \cdot R \cdot r3 + r1 + R + r3]$$

If r1, r2 and R are made to be larger than r3 and r4, the above mentioned expression for $r'_{out}$ changes to the following in leading order:

$$r'_{out} = r1 \cdot r4 \cdot (gm4+gmb4) \cdot R/(gm3+gmb3) \cdot R \cdot r3 = r1 \qquad \text{Eq}(2)$$

This change in value for $r'_{out}$ results in change in value for $r_{out}$ in Eq(1). With this value, the new output resistance will be:

$$r_{out} = (r1 \| r2) = r1/2 \qquad \text{Eq}(3) \because r1 = r2$$

This particular value is obtained since the total resistance of two equal resistors in parallel, will equal to half the value of a resistor.

Eq(3) shows that the output resistance $r_{out}$ is directly proportional to r1(=r2). Therefore $r_{out}$ can be increased by increasing the value of r1 and/or r2.

The output voltage is given by the following:

$$V_{out\,right}/V_{in} = \{(gm4+gmb4) \cdot r4+1\} \cdot gm3 \cdot r3 \cdot R \cdot r2/\text{deno} \qquad \text{Eq (4)}$$

$$V_{out\,left}/V_{in} = -gm3 \cdot r3 \cdot r1\{(gm4+gmb4) \cdot r4 \cdot R + r2 + r4 + R\}/\text{deno} \qquad \text{Eq (5)}$$

$V_{out\,right}$: Voltage of right side
$V_{out\,left}$: Voltage of left side deno=$r1 \cdot r4 \cdot (gm4+gmb4) \cdot R + r2 \cdot r3 \cdot (gm3+gmb3) \cdot R + R \cdot (r1+r2) + r3 \cdot r4 \cdot (gm3+gmb3+gm4+gmb4) \cdot R + (r2+r4) \cdot (r1+r3) + R \cdot (r3+r4)$ In the above calculations:
R—tail resistor
r1, r2—resistors connected between the drains of transistors N1, N2 and ground
r3, r4—resistance between the drain and source of N1 and N2 where $r=(1/\lambda \cdot I_D)$ for $[\lambda_{VDS} \ll 1]$
$V_{DS}$—Drain Source Voltage
gm3, gm4—transconductance of transistors N1 and N2
[Transconductance—the ratio of current change at the output port to the voltage change at the input port]
gmb3, gmb4—back gate transconductance of transistors N1 and N2
[Back gate transconductance—generally no larger than 30% of the main transconductance]

With enhanced r1, r2 and R both Direct Current (DC) gains become $(gm3 \cdot r4)/2$ in leading order. The value obtained for the gain, is equal to the value calculated using differential mode half circuit for the circuit shown in FIG. 4. This result shows that the circuit has an output resistance which is different from the resistance appearing in DC gain. A pole occurring from compensation capacitor 19 lies at $2/(r1 \cdot Cc)$. Therefore to get a pole in the same order as the ordinary circuit, Cc must be reduced by this calculated increase in resistance since the RC time constant should remain the same. Furthermore if compensation capacitors 19 are added to both sides of the circuit represented in FIG. 3, the first pole $1/(r1 \cdot Cc)$ is cancelled by zero, and the second pole appears at $1/(r3 \cdot Cc)$. So in this case, the practical output resistance is equal to that appears in gain. This is confirmed by calculating transfer function of this configuration and it is obtained by replacing r1 and r2 in Eq (4) and (5) with $r1/(1+s \cdot r1 \cdot Cc)$ and $r2/(1+s \cdot r2 \cdot Cc)$ respectively.

Figure 5:
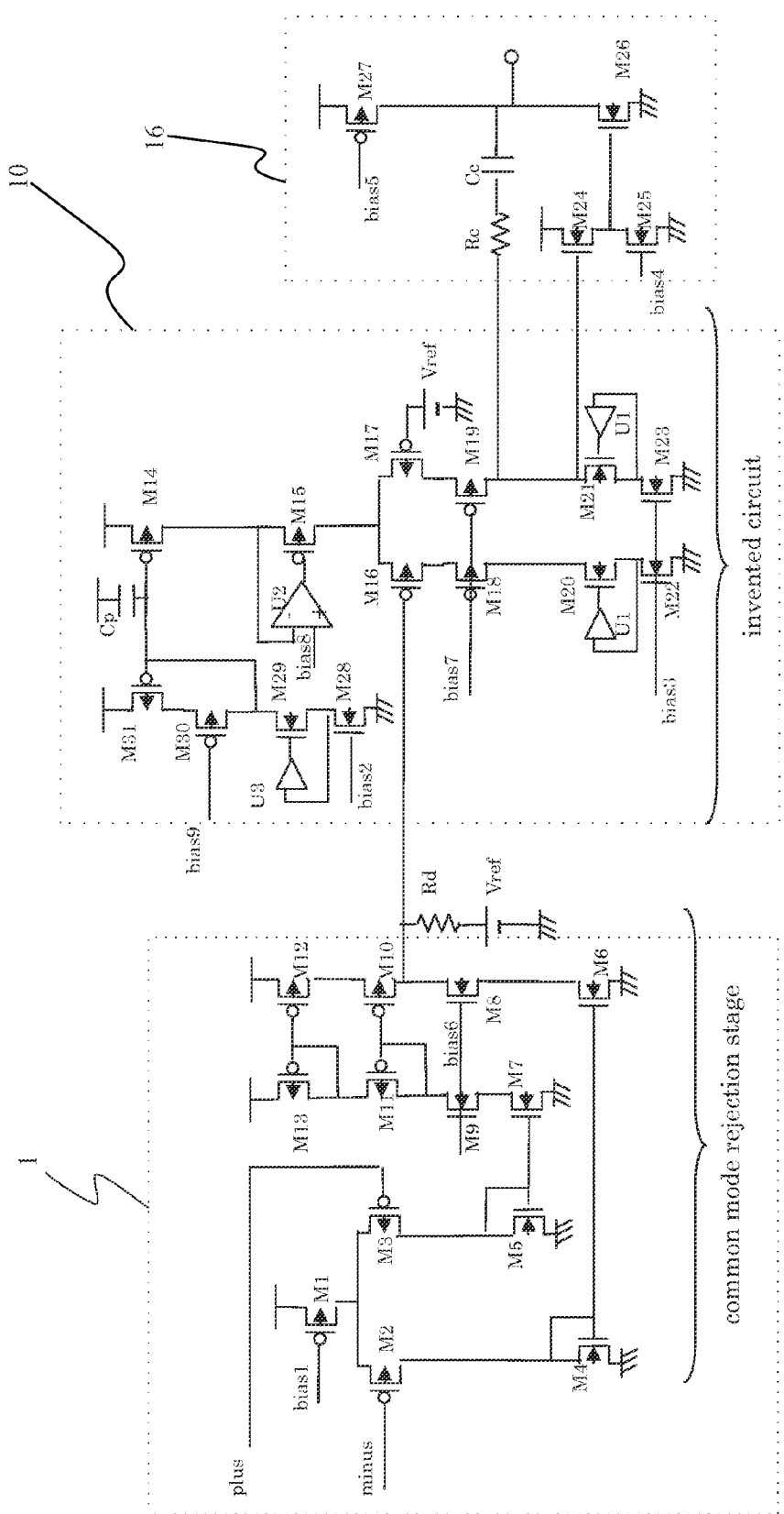
FIG. 5 is a circuit diagram of an Amplifier Circuit with improved slew rate, including a common mode rejection stage, a primary gain stage and an output stage.

Designing the circuit to have large r1 and r2 is the intention of the invention. However common mode signal for this stage is amplified with the gain r1/R, so R should also be designed to be large for better performance. With poor Common Mode Rejection Ratio (CMMR), common mode noise such as noise of $V_{ref}$ in FIG. 5 is amplified. This worsens the performance of the circuit.

FIG. 5 is an illustration of the above mentioned main segments in the present invention. This figure portrays a primary gain stage 10, cascade configuration, common mode rejection stage 1, reference voltage and a secondary gain stage 16.

The primary gain stage 10, appearing in the middle part of the circuit diagram represented by FIG. 5, is in a cascade configuration. This stage includes transistors 11 M14-M23, M28-M31 and Op-amps U1 12, U2 13 and U3 14.This cascade configuration, is used to prevent systematic offset from occurring. In the preferred embodiment of the present invention, transistors M18 and M19 have been used in this said configuration. Cascade configuration results in narrow common mode input range. Therefore a common mode rejection stage 1 is used before the primary gain stage 10 to reject common mode signals. As mentioned before, the invented circuit is used as the primary gain stage of the amplifier circuit to improve the slew rate of the amplifier circuit. In the preferred embodiment of the present invention, the resistance appears in DC gain is $(gm18 \cdot rds18) \cdot rds16$ and the output resistance of this stage is $[Au1*(gm20 \cdot rds20) \cdot rds22]/2$ where Au1 is the DC gain of U1 12. If U1 12 is a common source circuit, the gain of U1 12, Au1 is in the range of 10-100. This results in the output resistance being larger than the resistance appearing in the gain stage. The tail resistance of the section will be $Au2 \cdot gm15 \cdot rds15) \cdot rds14$ where Au2 is the DC gain of U2 13. U2 13 is connected to the gate of M15 in the preferred embodiment of the present invention. With the increased resistance, the compensation capacitance needs to be reduced. This results in the desired improved slew rate since the RC time constant shouldn't change. Additionally, the unity gain frequency of the invented circuit is proportional to $(Idc)^{1/2}(Au1 \cdot Cc)$ where Au1 is the DC gain of U1 12 and Idc is the DC operating current of this stage. As we see in FIG. 5 an additional gain stage is placed after the invented circuit. This secondary gain stage 16, as mentioned before is included because the gain stage has a narrow output range and is represented through transistors M24-M27 17. In the preferred embodiment of the present invention when Cc is connected between the gate of M24 and drain of M26, a negative feedback (NFB) is formed. Open loop gain of this loop converges to $Cc/(Cc+C_{prst}) \cdot gm24/(gm24+gmb24) \cdot gm26 \cdot (rds26\|rds27)$, where $C_{prst}$, is a parasitic capacitance lying at node to which gate of M24 and drain of M19 and M21 are connected. Due to this NFB, the output impedance of the amplifier circuit converges to $(Cc+C_{prst})/Cc \cdot (gm24+gmb24)/gm24/gm26$ with the frequency rise. Therefore, when this operational amplifier is used in closed loop configuration, the output impedance becomes $(rds26\|lrds27)/A$ for low frequencies and $(Cc+C_{prst})/Cc \cdot (gm24+gmb24)/gm24/gm26$ for high frequencies, where rds is the drain source resistance of the transistors M26 and M27 respectively, and A is the open loop gain at the frequency. If this output impedance is not small enough, a source follower should be placed after the common source circuit composed of M26 and M27.

In reference to FIG. 5, in the preferred embodiment transistors M1-M12 are used as the common mode rejection stage 1. In addition to the transistors, this section comprises of a resistor (Rd) 2 and the reference voltage ($V_{ref}$) 3. Resistor Rd is added connecting the reference voltage and the connection between the common mode rejection stage and the primary gain stage in order to locate a pole at a distance. If Rd is removed, resistance between ground and a node to which gate of M16 is connected becomes too large, so pole formed at this node moves to lower frequency, which invites instability. On the other hand, influence which mismatches of M16 and M17, M22 and M23 have on input offset becomes smaller as Rd becomes larger, so input offset is improved with large Rd. Output impedance of the circuit providing the mentioned $V_{ref}$ 3 might affect frequency characteristic, because voltage at gate of M17 yields fluctuation due to this output impedance.

For better frequency characteristics, circuit with small output impedance is preferred. And by making use of NFB, it is achieved. Output resistance $r(\omega)$ of a circuit with NFB loop is given by $$r(\omega)=rout/[1+A(\omega)]$$

Figure 6:
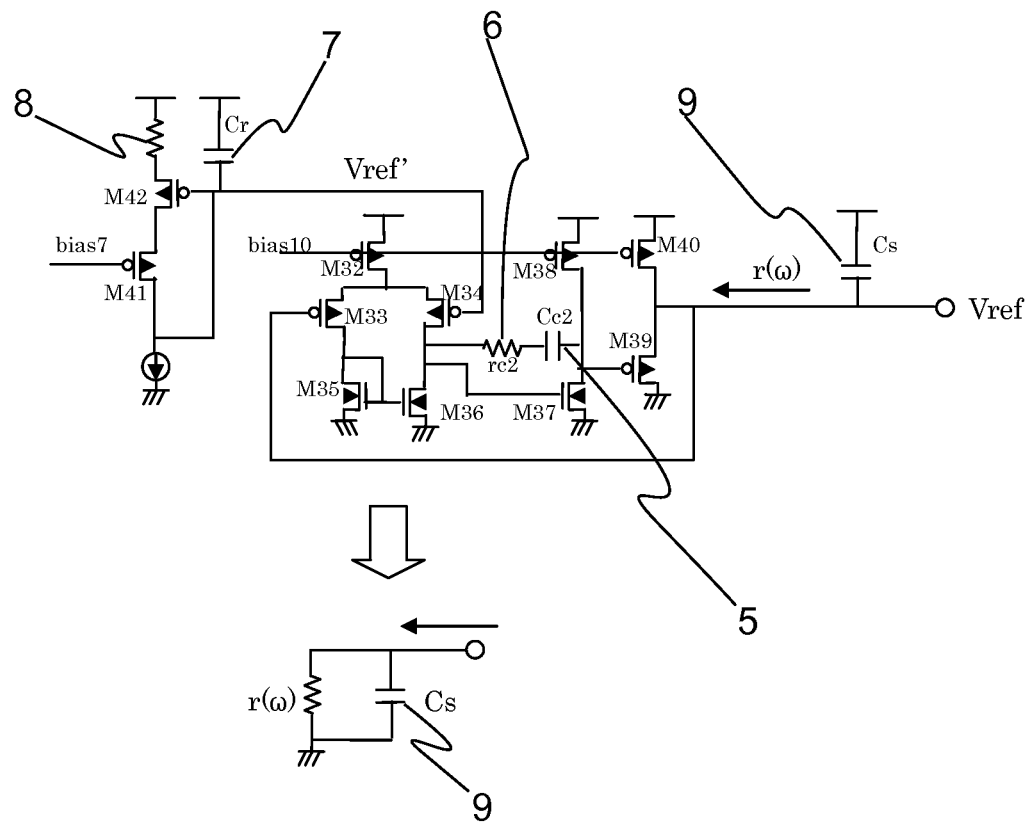
FIG. 6 is a circuit for providing reference voltage for the Amplifier Circuit.

, where rout is output resistance of the circuit in opened loop configuration and $A(\omega)$ is open loop gain at the frequency. This equation shows that output impedance of the circuit in closed loop configuration is reduced by the factor $[1+A(\omega)]$. And as mentioned below, $A(\omega)$ larger than 1 is obtained by placing both second pole and a zero used to cancel the second pole lower than unity gain frequency. FIG. 6 illustrates a circuit providing $V_{ref}$ 3. The open loop transfer function for the circuit is given by the following equation:

$$(V_{return}/V_{in}) \cong gm39 \cdot r_i \cdot r_o \cdot gm33 \cdot gm37 \cdot \{1 + s \cdot Cc2(rc2 - 1/gm37)\} /$$
$$(gm39 + s \cdot Cc2 \cdot gm39 \cdot gm37 \cdot r_o \cdot r_i + s^2 gm37 \cdot ro \cdot riCc2 \cdot Cs) \cong$$
$$r_i \cdot ro \cdot gm33 \cdot gm37 \cdot \{1 + s \cdot Cc2 \cdot (rc2 - 1/gm37)\}/$$
$$\{(1 + s \cdot gm37 \cdot ro \cdot ri \cdot Cc2) \cdot (1 + Cs/gm39)\}$$

Where $r_i=(rds33\|rds35)$, $r_o=(rds37\|rds38)$.

In this calculation, all of body transconductance and parasitic capacitance are ignored. By designing rc2 so that $Cc2(rc2-1/gm37)=Cs/gm39$, the second pole is cancelled by zero. In order to calculate $r(\omega)$, open loop function for the opamp in which Cs is removed is required and it is obtained by making Cs in the above equation equal to zero.

This results in the following expression:

$$(V_{return}/V_{in}) \cong r_i \cdot r_o \cdot gm33 \cdot gm37\{1+s \cdot Cc2(rc2-1/gm37)\}$$
$$(1+s \cdot gm37 \cdot ro \cdot ri \cdot Cc2)$$

Figure 7A:
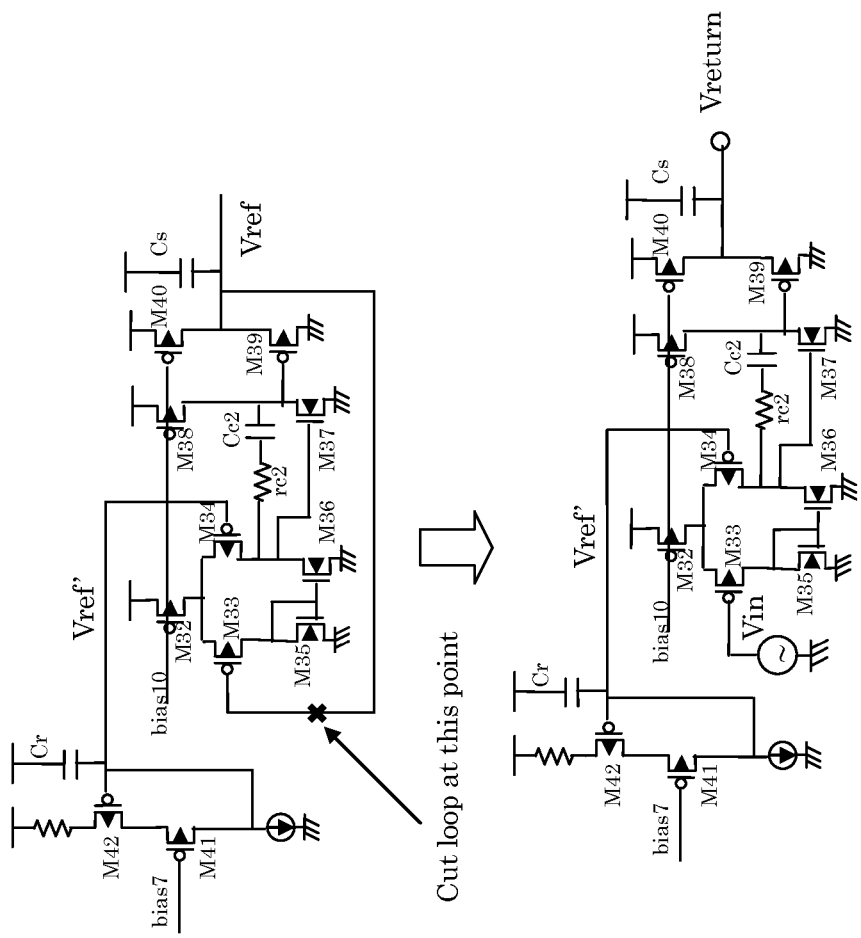
FIG. 7(a) is the reference voltage circuit when used to find the open loop characteristic.
Figure 7B:
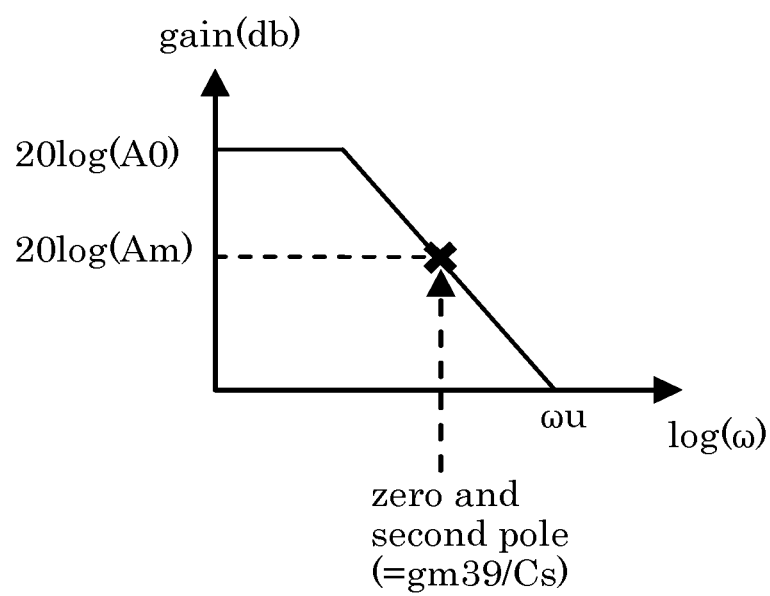
FIG. 7(b) is the open loop characteristic of the reference voltage circuit with a capacitor (Cs) included.
Figure 7C:
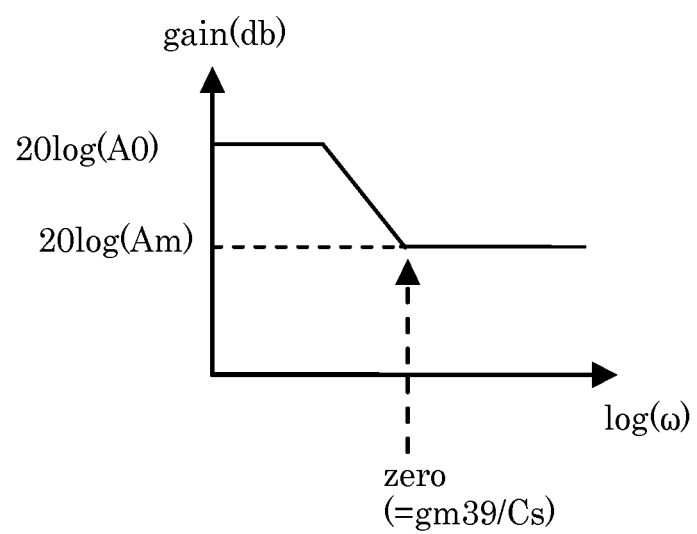
FIG. 7(c) is the open loop characteristic of the reference voltage circuit without a capacitor (Cs).

FIG. 7 shows the open loop characteristic and frequency dependence of the output resistance of the reference voltage circuit. Furthermore FIG. 7(b) is the open loop transfer function of the circuit with Cs included and FIG. 7(c) is the open loop transfer function of the circuit without Cs.

The following relationships hold for the open loop transfer function of the circuit:

$$A0=r_i \cdot r_o \cdot gm33 \cdot gm37$$

$$Am=gm33 \cdot (r_{c2}-1/gm37)$$

$$\omega_u=gm33/Cc_2$$

The preferred embodiment of the present invention comprises of transistors 4 M32-M42, Capacitors Cr 7, Cs 9, Cc2 5 and Resistors Rs 8, rc2 6. From the provided circuit diagram the output resistance is calculated to be:

$$\text{Output Resistance } r(\omega)=1/gm39/[1+A(\omega)]$$

gm39—transconductance of transistor M39 in the preferred embodiment of the present invention $A(\omega)$—open loop characteristic of this circuit omitting Cs.

Cs—Capacitor in $V_{ref}$ circuit between output and ground connection

Output Resistance $r(\omega)$ converges to $1/gm39/[1+Am]$ as frequency goes high. Output impedance is given by $(r(\omega)\|1/Cs)$.

Furthermore relating to FIG. 5, there are some other particular considerations about the configuration of the amplifier circuit. Transistors M8 to M11, M18 and M19 are placed to prevent systematic offset from occurring. Current occurring from variation of power supply goes through transconductances of M14, M15, M16, M17, M18 and M19, and then gets multiplied with resistance enhanced by cascade configuration to give voltage which is added to gate of M24. In order to keep good power supply rejection ratio (PSRR), the circuit should be designed so that the current becomes small. Therefore a current source with high output resistance like one consisting of M28, M29 and U3 is recommended to transmit the tail current (operating current of M14).

Figure 8:
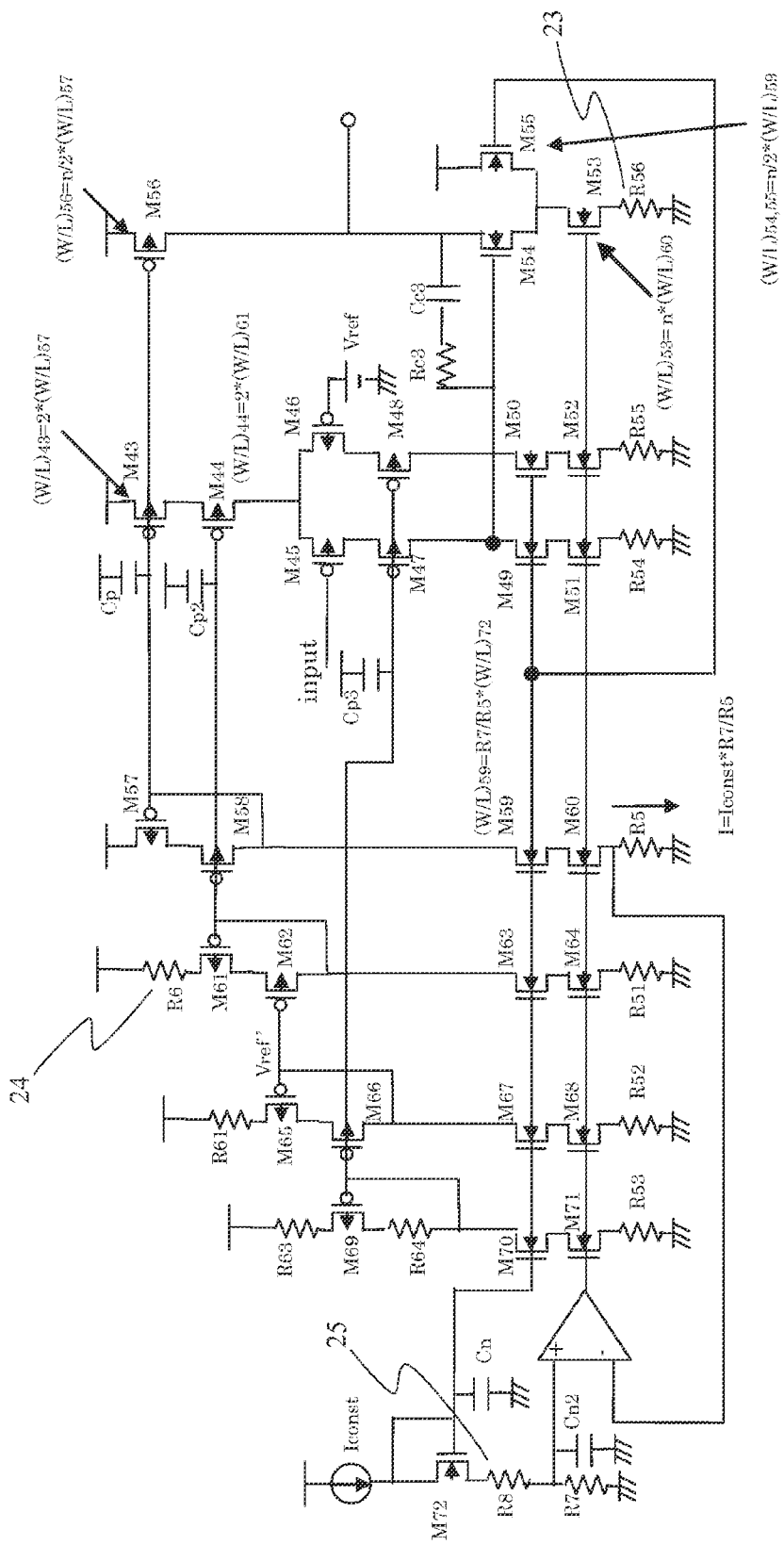
FIG. 8 illustrates another implementation of the Amplifier circuit with improved slew rate.
Figure 9:
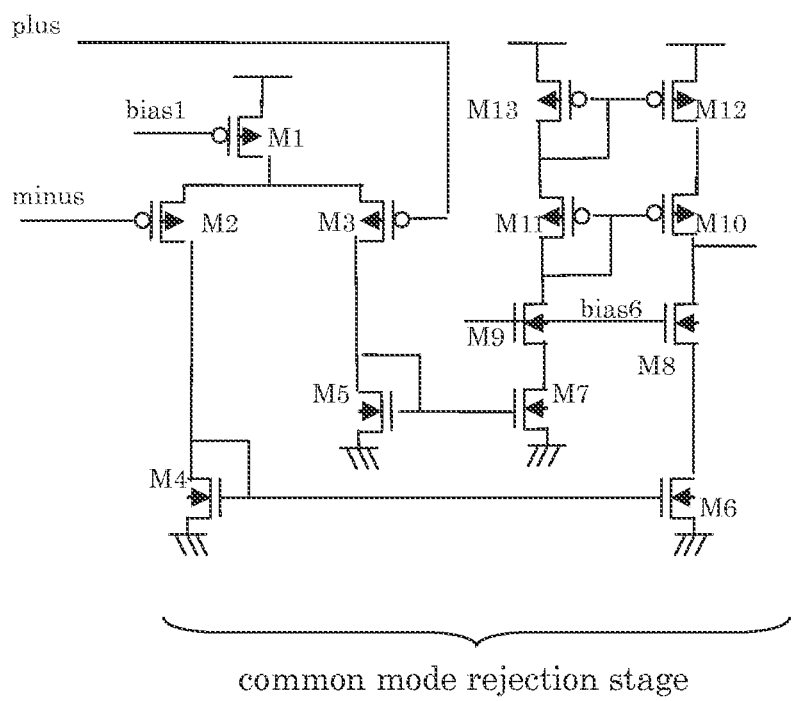
FIG. 9 illustrates the section of the circuit representing the common mode rejection stage in FIG. 5.
Figure 10:
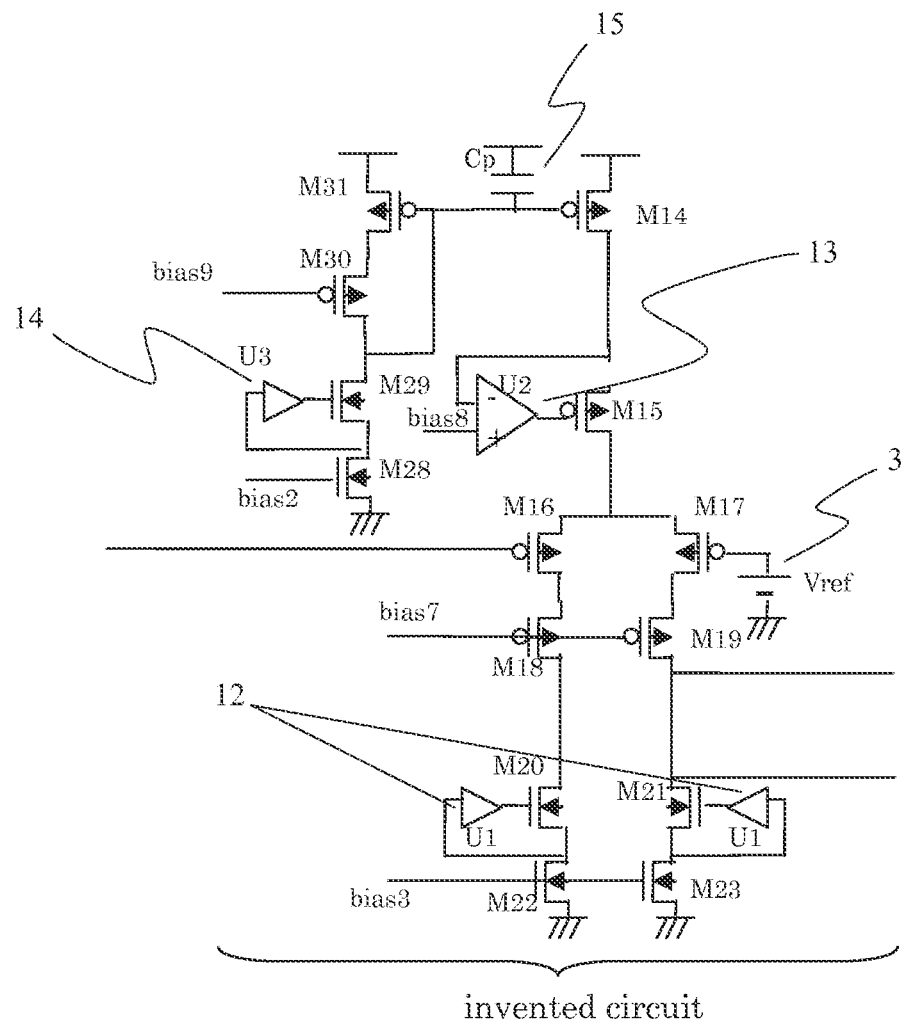
FIG. 10 illustrates the invented circuit section in FIG. 5.
Figure 11:
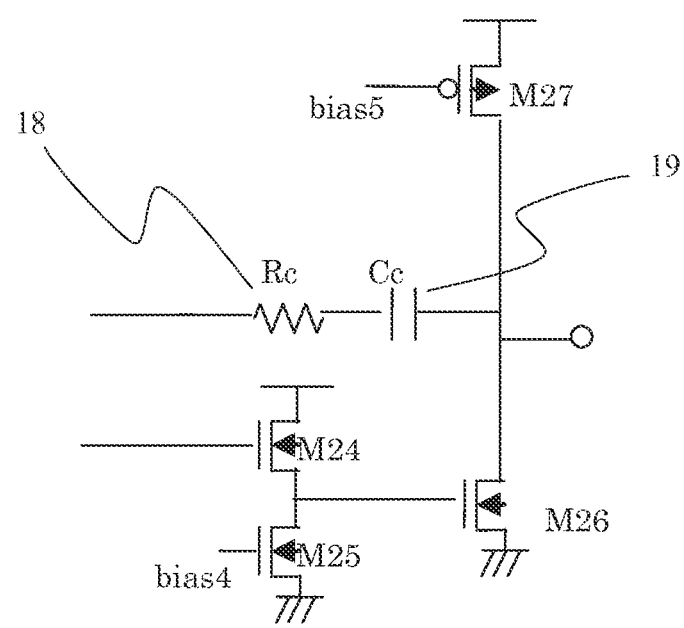
FIG. 11 illustrates the secondary gain stage containing the Compensation Capacitance in FIG. 5.

The circuit diagram in FIG. 8 illustrates another implementation of the amplifier circuit with improved slew rate. In the preferred embodiment of the present invention, this circuit comprises of transistors M43-M72, capacitors Cn, $Cn_2$, Cp, $Cp_2$, $Cp_3$, $Cc_3$ and resistors R5, R6, R7, R8, R51-R56, R61-R64, $Rc_3$. A circuit comprising transistors provides bias voltages for the primary gain stage 10. In the preferred embodiment transistors 21 M57-M72 provides bias voltages to transistors 22 M43, M44 and M47-M56. The unity gain frequency is proportional to $1/(R5 \cdot Cc)$. In the preferred embodiment of the present invention, R5 23 is the resistor connected to source of the transistor M60. The current through this resistor is $I=I_{const} \cdot (R7/R5)$, where R7 is the resistor connected in parallel to the capacitor $Cn_2$ and $I_{const}$ is the current flowing to the drain of M72. Additionally, the values of resistances R51, R52, R53, R54, R55 are equal to the value of the above mentioned R5 resistor. An additional resistor (R6) 24 is added to set the drain source voltage ($V_{DS}$) of the transistors in the primary gain stage 10. In the preferred embodiment this includes transistors M43-M46. Also in the present invention, the resistor (R64) connected between transistors M69 and M70 is equal to the value of R6 and the resistor connected to source of M65 and M69 is twice and thrice as large as R6 respectively. Another resistor (R8) 25 is placed to set $V_{DS}$ of a section of the primary gain stage 10. In the present invention this would be the transistors M51, M52 and M53. Additionally in the preferred embodiment of the current invention the following relationships hold with regards to transistor sizes:

$$(W/L)_{43}=2 \cdot (W/L)_{57}$$

$$(W/L)_{44}=2 \cdot (W/L)_{61}$$

$$(W/L)_{59}=(R7/R5)\cdot(W/L)_{72}$$

$$(W/L)_{56}=n/2\cdot(W/L)_{57}$$

$$(W/L)_{54}=(W/L)_{55}=n/2\cdot(W/L)_{59};$$

where W represents the width and L represents the length of the transistor gate.

Although the current invention has been explained in reference to its preferred embodiment, it is to be understood that many other possible modifications and variations can be made without departing from the spirit and scope of the invention as in hereinafter defined by the appending claims.

What is claimed is:

1. An amplifier circuit for improved slew rate comprises
    a common mode rejection stage;
    a primary gain stage;
    an output stage;
    said primary gain stage comprising a circuit for enhancing a first output impedance;
    a reduced compensation capacitor being needed to obtain a frequency pole, wherein said frequency pole is the same to an ordinary amplifier's frequency pole;
    said compensation capacitor being added to only one side of a differential op-amp circuit;
    an output voltage being taken from the same side where said phase compensation capacitor is added;
    said primary gain stage adopting a cascade configuration;
    said cascade configuration preventing a systematic offset;
    said cascade configuration regulating a common mode input range of said amplifier circuit;
    said common mode rejection stage being before said primary gain stage;
    said common mode rejection stage rejecting a common mode signal;
    the differential op-amp circuit comprising resistors r1, r2, r3, r4 and R;
    said cascade configuration comprising transistors M16, M17, M22 and M23;
    said primary gain stage comprising a common source circuit;
    said common mode rejection stage comprising transistors M8, M9, M10, M11, M18 and M19; and
    the resistors r1, r2 and R being larger than the resistors r3 and r4.

2. The amplifier circuit with improved slew rate as claimed in claim 1, comprising:
    said output stage comprising a secondary gain stage.

3. The amplifier circuit with improved slew rate as claimed in claim 2, comprising:
    said secondary primary gain stage comprising transistors M24, M25, M26 and M27; and
    a source follower and resistance being between a gate and a drain of M26.

4. The amplifier circuit with improved slew rate as claimed in claim 1, further comprising:
    a reference voltage circuit; and
    said reference voltage circuit providing a reference voltage to said amplifier circuit.

5. The amplifier circuit with improved slew rate as claimed in claim 4, comprising;
    said reference voltage circuit comprising a second output impedance; and
    said second output impedance preventing a variation of said reference voltage.

6. An amplifier circuit for improved slew rate comprises
    a common mode rejection stage;
    a primary gain stage;
    an output stage;
    said primary gain stage comprising a circuit for enhancing a first output impedance;
    a reduced compensation capacitor being needed to obtain a frequency pole, wherein said frequency pole is the same to an ordinary amplifier's frequency pole;
    said compensation capacitor being added to only one side of a differential op-amp circuit;
    an output voltage being taken from the same side where said phase compensation capacitor is added;
    said primary gain stage adopting a cascade configuration;
    said cascade configuration preventing a systematic offset;
    said cascade configuration regulating a common mode input range of said amplifier circuit;
    said common mode rejection stage being before said primary gain stage;
    said common mode rejection stage rejecting a common mode signal;
    the differential op-amp circuit comprising resistors r1, r2, r3, r4 and R;
    said cascade configuration comprising transistors M16, M17, M22 and M23;
    said primary gain stage comprising a common source circuit;
    said common mode rejection stage comprising transistors M8, M9, M10, M11, M18 and M19; and
    the resistors r1, r2 and R being larger than the resistors r3 and r4.

7. The amplifier circuit with improved slew rate as claimed in claim 6, comprising:
    said output stage comprising a secondary gain stage;
    said secondary primary gain stage comprising transistors M24, M25, M26 and M27; and
    a source follower and resistance being between a gate and a drain of M26.

8. The amplifier circuit with improved slew rate as claimed in claim 6, further comprising:
    a reference voltage circuit;
    said reference voltage circuit providing a reference voltage to said amplifier circuit;
    said reference voltage circuit comprising a second output impedance; and
    said second output impedance preventing a variation of said reference voltage.

* * * * *